(12) United States Patent
Cosand et al.

(10) Patent No.: US 8,050,644 B1
(45) Date of Patent: Nov. 1, 2011

(54) HIGHLY LINEAR MIXER AND METHOD FOR CANCELLING FET CHANNEL RESISTANCE MODULATION

(75) Inventors: Albert E. Cosand, Agoura Hills, CA (US); Joseph F. Jensen, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 497 days.

(21) Appl. No.: 12/337,379

(22) Filed: Dec. 17, 2008

Related U.S. Application Data

(60) Provisional application No. 61/008,343, filed on Dec. 18, 2007.

(51) Int. Cl.
*H04B 1/10* (2006.01)

(52) U.S. Cl. .......... 455/295; 455/333; 455/296
(58) Field of Classification Search .......... 455/295, 455/296, 333, 318; 330/227; 327/108
See application file for complete search history.

(56) References Cited

U.S. PATENT DOCUMENTS

| | | | | |
|---|---|---|---|---|
| 6,819,914 | B2 * | 11/2004 | Yan et al. | 455/318 |
| 6,847,805 | B2 * | 1/2005 | Liu | 455/69 |
| 7,420,418 | B2 * | 9/2008 | Park et al. | 330/277 |
| 2008/0030240 | A1 * | 2/2008 | Scheuerlein | 327/108 |
| 2009/0075621 | A1 * | 3/2009 | Christoffers et al. | 455/333 |

* cited by examiner

*Primary Examiner* — Peguy Jean Pierre
(74) *Attorney, Agent, or Firm* — Ladas & Parry

(57) ABSTRACT

A highly linear mixer and method for cancelling field effect transistor channel resistance modulation are provided. At least a portion of the voltage of an input signal is added to a drive signal to cancel distortion arising from modulation of the voltage of the input signal.

17 Claims, 3 Drawing Sheets

US 8,050,644 B1

HIGHLY LINEAR MIXER AND METHOD FOR CANCELLING FET CHANNEL RESISTANCE MODULATION

CROSS-REFERENCE TO RELATED APPLICATIONS

This application claims the benefit under 35 U.S.C. §119 (e) of the following co-pending United States provisional patent application which is expressly incorporated herein in its entirety: U.S. Provisional Application No. 61/008,343, filed Dec. 18, 2007 and entitled "Highly Linear Mixer and Method for Cancelling FET Channel Resistance Modulation".

BACKGROUND

1. Field

The present disclosure relates to a mixer, and more particularly to a field effect transistor (FET) mixer having reduced levels of intermodulation distortion.

2. Related Art

A mixer circuit converts radio frequency (RF) power into power at another frequency to make signal processing easier and more efficient. More particularly, a RF input signal is converted, i.e., shifted, by the mixer circuit into an intermediate frequency (IF) output signal. A mixer circuit will also be referred to as a mixer herein. Mixers are a fundamental component of communication systems, providing improved filtering and easier implementation of low noise/high gain amplification at the intermediate frequency than possible when processing signals at the radio frequency.

A mixer converts the RF input signal into the IF output signal by multiplying the RF input signal with a local oscillator (LO) input signal which provides the power, i.e., voltage, for the conversion. A LO input signal is often referred to as LO drive. In an ideal mixer, multiplication of the RF input signal with the LO input signal would result in two only outputs: a first one at the frequency sum of the RF input signal and LO input signal, and a second one another at the frequency difference between the RF input signal and LO input signal. These can be easily filtered to obtain the desired IF output signal and to reject the other. In practice, however, a mixer generates undesirable intermodulation products, i.e., intermodulation distortion, which obscure the desired IF output signal. Intermodulation distortion results from non-linear mixer response to RF input signals. Intermodulation distortion typically begins to appear in a mixer's output when the power level of the RF input signal increases beyond the +1 dB compression point, to be discussed further below.

A third-order intermodulation product occurs, most typically, when a second input signal arrives at the mixer input along with the desired RF input signal. Of the different intermodulation products which may be produced by a mixer, the third-order intermodulation product is closest in frequency to the desired IF output signal. Because of the closeness of the frequency of the third-order intermodulation product to the desired frequency of the IF output signal, it is oftentimes difficult to filter out the third-order intermodulation product, e.g., remove or suppress from the IF output signal. Third-order intermodulation distortion generated by a mixer will be discussed further below.

Mixer performance can be measured in various ways. One measure is known as dynamic range. A mixer's dynamic range defines the range of RF input signal power over which a mixer provides useful operation, i.e., the range of RF input signal power in which a non-degraded IF output signal is generated by the mixer. The upper limit of the dynamic range is typically defined as the +1 dB compression point of the mixer. The lower limit of the dynamic range is generally defined as the noise figure of the mixer.

As the power level of the RF input signal increases from zero, the power level of the IF output signal linearly follows. However, at a certain RF input signal power level the IF output signal power level no longer follows the RF input signal in linear progression. At this point the power level of the IF output signal increases at a slower rate until the power level of the IF output signal becomes almost level. The RF input signal power level above which the IF output signal deviates from linearity is known as conversion compression and is another mixer performance measure.

Conversion loss, expressed in dB, is another measure of mixer performance. Conversion loss describes the efficiency of a mixer in providing frequency translation between the RF input signal and the IF output signal and relates to loss of power between the RF input signal and the IF output signal during frequency translation. Thus, conversion loss is equal to the ratio of the power level of the IF output signal to the power level of the RF input signal at a specified power level of the LO drive. A specified power level for the LO drive is necessary because conversion loss varies as the power level of the LO drive varies.

The RF input signal power level at which the conversion loss increases by 1 dB is known as the +1 dB compression point and is still another mixer performance measure. The +1 dB compression point is utilized as the top of the dynamic range because RF input signal power beyond the +1 dB compression point generally is not converted into the desired IF output signal, but instead converted into heat and intermodulation products, i.e., distortion. Thus, the +1 dB compression point is the maximum RF signal input power level at which the mixer is designed to be used. In general, the +1 dB compression point is 5 to 10 dB lower than the LO drive power.

Introduced above, the lower limit of the dynamic range of a mixer is, by usual convention, defined to be the noise figure of the mixer. Noise figure, yet another mixer performance measure, is a measure, expressed in dB, of the degradation of the signal to noise ratio caused by the mixer. Noise figure is calculated by dividing the signal-to-noise ratio at the RF signal input by the signal-to-noise ratio at the IF signal output. Noise figure is typically +1 dB above a mixer's conversion loss.

Another measure of mixer performance reflects a mixer's ability to suppress IF output signal distortion caused by third-order intermodulation products and is known as a third-order intercept point, commonly abbreviated IP3. IP3 is expressed in dBm and is determined using the "third-order intercept" technique for modelling nonlinear systems and devices. This mathematical construct is based upon low order polynomials derived by Taylor series expansion.

Output IP3 and input IP3 are both commonly specified for mixers. Output IP3 is the difference between a mixer's input IP3 and the mixer's conversion loss. Thus, higher conversion losses result in lower output IP3.

A mixer's input IP3 is a theoretical point on a RF input signal power versus IF output signal power curve where the power level of the desired IF output signal and power level of the third-order intermodulation products become equal in amplitude as the power level of the RF input signal is raised. In other words, input IP3 is the point of intersection of an extrapolation of the linear primary response of the mixer and the third-order intermodulation response of the mixer past the +1 dB compression point until they equal each other. A higher input IP3 indicates better mixer performance, reflecting a mixer's ability to handle higher RF input signal power levels before third-order intermodulation products cause distortion in the desired IF output signal.

Three typical types of mixer circuits are single ended mixer circuits, balanced mixer circuits, and double balanced mixer circuits. Several prior art double balanced mixers are known. One such known double balanced mixer design uses a schottky diode quad, or ring, circuit that uses four diodes with all of the diodes pointed in the same direction. Another known double balanced mixer design is known as a called a star circuit and uses two diodes pointing toward a central node and two diodes pointing away from the central node. Double balanced mixers with schottky diodes typically have an input IP3 of 25 to 30 dBm, with 30 dBm being the practical upper limit of the design type. As the input IP3 of a schottky diode double balanced mixers approaches 30 dBm, the mixer becomes both difficult to tune and expensive, which increases both the manufacturing complexity and cost. Another drawback to the diode-based double balanced mixer design is that they require large LO drive levels to obtain a high input IP3, which for many applications and systems is not practical.

Another type of double balanced mixer circuit uses field effect transistors (FET) as the mixing element instead of diodes. Double balanced FET-based mixers, often referred to as FET mixers, or resistive mixers, can achieve a higher value of input IP3 than diode-based mixers. It is common for double balanced FET mixers to have an input IP3 greater than 30 dBm. However, in these FET-based mixers the increased IP3 comes at the cost of higher conversion losses and higher noise figures.

FIG. 1 shows a schematic diagram of a known double balanced resistive FET mixer 10 which attempts to address these shortcomings. The circuit design of mixer 10 attempts to achieve high input IP3 performance of other FET-based mixers, while also having a low noise figure and without having substantial conversion loss. Commercially available FET mixers having design similar to that shown in FIG. 1 are the HJK series of FET mixers available from the manufacturer Mini-Circuits® of Brooklyn, N.Y., 11235. The HJK series manufacturer reports performance characteristics of its double balanced resistive FET mixers of up to 38 dBm output IP3 with a LO drive level of 19 dBm.

The double balanced resistive FET mixer 10 of FIG. 1 has a design similar to the well known diode-based quad mixer, introduced above. Mixer 10, a passive device, includes four identical field effect transistors Q1, Q2, Q3, Q4 arranged in a quad configuration and which function as mixing elements. When a field effect transistor is conducting it is said to be in an 'on' state. Likewise, when a field effect transistor is not conducting it is said to be in an 'off' state.

The double balanced resistive FET mixer 10 also includes a local oscillator input terminal LO connected to balanced-unbalanced (balun) LO transformer T1. The LO input terminal receives a local oscillator input signal (i.e., LO drive), and LO balun T1 couples the received LO input signal to the gate terminal G of each respective FET Q1, Q2, Q3, Q4.

Mixer 10 also includes a radio frequency input terminal RF connected to balanced-unbalanced (balun) RF transformer T2. The RF input terminal receives a radio frequency input signal, and RF balun T2 couples the received RF input signal to the FETs Q1, Q2, Q3, and Q4. Also included in mixer 10 is an intermediate frequency output terminal IF connected to balanced-unbalanced (balun) IF transformer T3. IF balun T3 couples output from each FET Q1, Q2, Q3, Q4 to the IF output terminal.

Each respective FET Q1, Q2, Q3, Q4 has a gate terminal G for controlling whether that FET is conducting or not conducting, as is well known in the art. Thus, when one of FETs Q1, Q2, Q3, Q4 is conducting it can be described as being 'gated on'. With reference to FIG. 1, the gate terminal G of FET Q1 is connected to the gate terminal G of FET Q3, and the gate terminal G of FET Q2 is connected to the gate terminal G of FET Q4. FET Q1 and FET Q3 can be referred to as gate-connected FET pair Q1,Q3. Likewise, FET Q2 and FET Q4 can be referred to as gate-connected FET pair Q2,Q4.

It will also be recognized by those having familiarity with field effect transistors that in addition to gate terminal G, each of the four FETs Q1, Q2, Q3, Q4 also has two terminals between which current can flow. By convention, one is known as the source terminal and the other is known as the drain terminal, dependent upon the direction of current flow between the two terminals. Source terminals and drain terminals of the same FET are structurally identical. As also will be recognized, current flow direction in a FET can be controlled such as by biasing one and/or the other of these two terminals. Because each of the FETs Q1, Q2, Q3, Q4 is built symmetrically from a source-to-terminal perspective, and because during operation of the mixer 10 each of the FETs Q1, Q2, Q3, Q4 is operated without biasing either of these two terminals, each of the FETs Q1, Q2, Q3, Q4 may be thought of as a symmetrical device having equivalent source and drain terminals. Accordingly, source terminals and drain terminals are not differentiated in FIG. 1.

During operation of mixer 10, when the LO input signal is in its positive half-cycle, two gate-connected FETs conduct, while the other two gate-connected FETs do not conduct. The converse is true when the LO input signal is in its negative half-cycle. The LO input signal switches Q1 and Q3 on and off in anti-phase with Q3 and Q4. The frequency at which the gate-connected FET pairs switch state, i.e. switch from conducting to not conducting, is dependent upon the frequency of the LO input signal at LO.

In general, current flow between source and drain terminals is controlled by gate voltage (the voltage between the gate and source terminals). A threshold voltage of a typical FET, such as FETs Q1, Q2, Q3, Q4, is defined as the gate voltage at which a conductive channel is formed between source terminal and drain terminal. Thus, if the gate voltage is below the threshold voltage, an FET is in the 'off' state, and if the gate voltage is above the threshold voltage, an FET is in the 'on' state.

In mixer 10 a gate bias at the gate terminal G of each FET Q1, Q2, Q3, Q4 alters gate voltage at the gate G, As will be understood from the above, when gate bias causes the gate voltage at any one of the FETs Q1, Q2, Q3, Q4 to rise above threshold voltage, that one FET begins to conduct. It will readily be understood that gate-connected FET pair Q1,Q3 share the same gate bias, as do gate-connected FET pair Q2,Q4

Gate bias in Mixer 10 can be introduced in two ways. Typically, gate bias is generated by gate current that flows at the positive peak of the voltage swing of the LO input signal. Alternatively, gate bias may be supplied externally by optional voltage source Vg and associated biasing circuitry (not shown in FIG. 1). As shown in FIG. 1, optional voltage source Vg is applied to LO drive through LO balun T1 to provide gate bias.

Operation of mixer 10 having gate bias generated by gate current will now be described. When the LO input signal drives the gate terminals G of FET pair Q1,Q3 more positive than their voltage, the behaviour of FET Q1 and FET Q3 can each be approximated as a simple resistive connection, i.e., channel, between the RF balun T2 and IF balun T3. And similarly, when the LO input signal drives gate terminals G of FET pair Q2,Q4 more positive than their voltage threshold, the behaviour of FET Q2 and FET Q4 can likewise be approximated as simple a resistive connection, having an opposite polarity than that of FETs Q1 and Q3, between RF balun T2 and IF balun T3. This polarity shift between baluns T2 and T3 driven by the LO input signal provides the desired mixing action. The resistance of a conducting FET can be referred to as FET channel resistance and will be further described below.

Introduced above, field effect transistors Q1, Q2, Q3, and Q4 are considered to be symmetrical devices. However, the approximation of entirely symmetrical behaviour for each of the FETs Q1, Q2, Q3, and Q4 such that each FET Q1, Q2, Q3, Q4 acts as a simple resistive connection, i.e., channel, when gated on is not accurate. This is because the voltage of the RF input signal at the RF terminal, i.e., the RF voltage, is not static, but rather varies. As the RF voltage varies, the voltage drop across a conducting FET Q1, Q2, Q3, Q4 likewise varies.

The value of the FET channel resistance of a conducting FET Q1, Q2, Q3, Q4 is dependent upon the voltage between that FET's gate terminal G and the more negative one of that FET's source terminal and drain terminal. Thus, the FET channel resistance between RF balun T2 and IF balun T3 through a conducting FET Q1, Q2, Q3, Q4 is not constant. It is modulated by and dependent upon the amplitude of the RF voltage at any given time. Accordingly, the FET channel resistance of a conducting FET in mixer 10 can more accurately be referred to as modulated FET channel resistance.

The varying FET channel resistance, modulated by RF voltage, present in each FET Q1, Q2, Q3, Q4 of mixer 10 causes undesirable intermodulation distortion, including third-order intermodulation distortion, in the IF output signal of mixer 10.

SUMMARY

In accordance with the present invention, a method for cancelling channel resistance modulation in a field effect transistor (FET) used in a frequency mixer is provided. The method includes applying a bias to the field effect transistor to distinguish the transistor's drain from the transistor's source such that channel resistance is associated with voltage between the gate and the source. At least a portion of the voltage of a radio frequency input signal is superimposed on a LO signal, forming a modified LO signal. The modified LO signal is input to the gate while the radio frequency input signal in input to the source.

Preferably, the bias is applied such that channel resistance is not associated with voltage between the drain and the gate. Also preferably, the bias causes voltage between the gate and the drain to be greater than voltage between the gate and the source. Preferably, the applied bias is a voltage is applied to the transistor's drain. And, also preferably, the radio frequency voltage is superimposed such that channel resistance is associated with the LO signal and not the radio frequency signal.

In another preferable aspect of the method, the bias is applied such that an amount of channel resistance is dependent upon only voltage between the gate and the source. In this other aspect, the gate voltage is the same as the voltage of the modified LO signal, the source voltage is the same as the radio frequency voltage, and the radio frequency voltage is superimposed such that no net radio frequency voltage appears between the gate and the source. In an even further aspect, the superimposed portion of the radio frequency voltage is less than the entire radio frequency voltage.

In accordance with another aspect the present invention, a field effect transistor mixer for mixing a radio frequency (RF) input signal is provided. The radio frequency input signal is received at an RF terminal, a local oscillator (LO) signal is received at an LO terminal, and a low distortion intermediate frequency (IF) signal is output at an intermediate frequency terminal IF.

The mixer includes an RF signal coupler connected to the RF terminal. The RF signal coupler has a first RF port for outputting a first phase of the RF input signal and a second RF port for outputting the second phase of the RF input signal. The mixer also includes a LO signal coupler connected to the LO terminal. The LO signal coupler has a first LO port for outputting a first phase of the LO signal and a second LO port for outputting the second phase of the LO signal.

The mixer also includes first and second transformers, each for superimposing at least a portion of the voltage of the RF input signal to the LO signal to form a modified LO signal. The first transformer connected to the first LO port and to the RF terminal, and the second transformer is connected to the second RF port and to the RF terminal.

A first pair of FETs is also included. The gate of each is connected to the first transformer to receive the modified LO signal, and the source of each is connected to the RF coupler to receive the RF input signal. One source is connected to the first RF port, and the other source is connected to the second RF port;

Also included is a second pair of FETs. The gate of each is connected to the second transformer to receive the modified LO signal, and the source of each is connected to the RF coupler to receive the RF input signal. One source of he second pair is connected to the first RF port, and the other source is connected to the second RF port.

The mixer also includes a drain bias circuit for biasing each FET to distinguish gate from source such that voltage between the gate and the drain is greater than voltage between gate and the source, as well as an IF coupler. The IF coupler is connected to the drain of each FET and to the IF terminal to receive an output signal from each FET and to combine the received output signals into the IF output signal having low distortion.

Preferably, the IF output signal is not distorted by voltage modulation of the radio frequency signal. Preferably, the drain bias circuit biases each field effect transistor such that voltage at the drain does not contribute to channel resistance. Also preferably, the drain biasing circuit biases each FET such that an amount of channel resistance is dependent upon only voltage between the gate and the source. Preferably, the drain biasing circuit applies a voltage to the drain of each FET.

According to another preferred aspect of the mixer, the first and second transformers superimpose the radio frequency voltage such that the radio frequency input signal does not contribute to channel resistance. In another aspect, the drain biasing circuit biases each FET such that an amount of channel resistance is dependent upon only voltage between the gate and the source, the gate voltage of each FET is the same as the voltage of the modified LO signal applied to that gate, the source voltage of each FET is the same as the voltage of the RF input signal applied to that source, and each transformer superimposes the RF voltage such that for each FET, no net RF voltage appears between the gate and source. Preferably, the superimposed portion of the RF voltage is less than the entire RF voltage.

DETAILED DESCRIPTION

Figure 1:
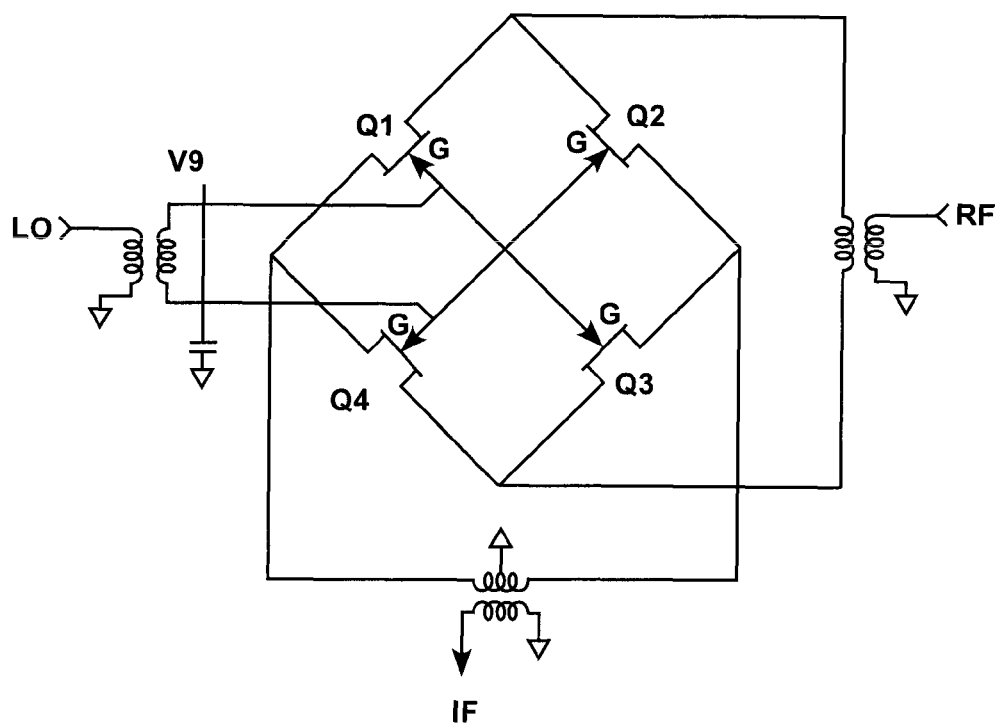
FIG. 1 is a schematic view of a prior art FET mixer circuit.
Figure 2:
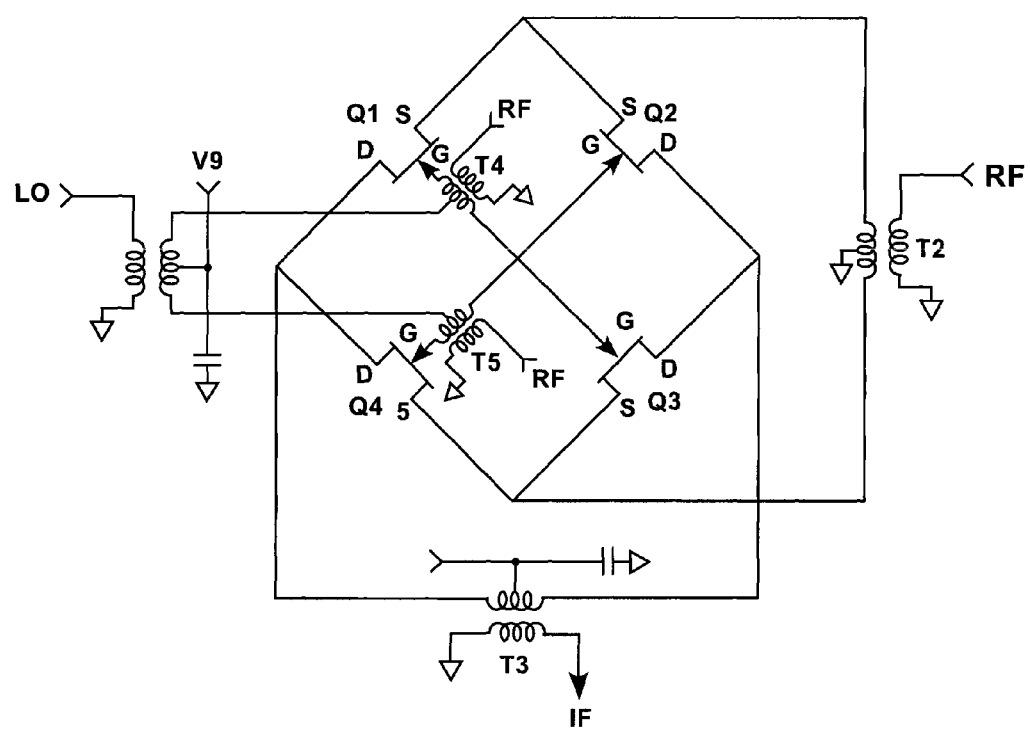
FIG. 2 is a schematic view of one preferred embodiment of a FET-based mixer circuit.

Referring to FIG. 2, a schematic view of one preferred embodiment of a highly linear double balanced resistive field effect transistor (FET) mixer 20 is shown. Highly linear mixer 20 produces significantly lower levels of intermodulation distortion, including third-order intermodulation distortion, than known FET mixers when operating at similar LO input signal power levels (i.e., LO drive levels) by preventing RF voltage from modulating gate voltage in field effect transistors. In particular, mixer 20 produces significantly lower levels of intermodulation distortion, including third-order intermodulation distortion, than the double balanced FET mixer 10 described above when mixer 10 and mixer 20 are operated at similar LO drive levels. That is, mixer 20 has a more linear response to RF input signals than existing FET mixers, including mixer 10.

The reduction in intermodulation distortion levels is achieved as a result of a modulation cancellation method that prevents a varying RF voltage from modulating FET channel resistance. The specific circuit design elements and operational parameters of highly linear mixer 20 utilized in implementing the modulation cancellation scheme will be discussed in detail below. Because of its improved distortion levels, the highly linear mixer 20 preserves the fidelity of smaller amplitude signals that are in the presence of larger amplitude signals that have frequencies near to that of the smaller amplitude signals.

The highly linear double balanced resistive FET mixer 20 includes field effect transistors Q1, Q2, Q3, and Q4. The four FETs Q1, Q2, Q3, Q4 are symmetrical from a source/drain perspective, arranged in a quad configuration, and function as mixing elements. As shown in FIG. 2, each respective FET Q1, Q2, Q3, and Q4 has a source terminal S, a drain terminal D, and a gate terminal G. FETs Q1, Q2, Q3, and Q4 of mixer 20 are n-channel FETs, though other types of FETs may, as desired, be utilized in mixer 20. Desirable characteristics of FETs Q1, Q2, Q3, and Q4 of mixer 20 include a high transconductance and a low capacitance, typical of RF FETs. Also desirable is high gate-to-source breakdown voltage, as is typical of a gallium nitride FET.

Highly linear mixer 20 also includes input terminals LO and RF, output terminal IF, LO transformer T1, RF transformer T2, IF transformer T3. Also included will are first gate transformer T4, and second gate transformer T5.

It should be understood that though highly linear mixer 20 is shown in FIG. 2 and described herein as having RF, IF, and LO transformers for coupling various signals in and out, it will be understood that any of these transformers can be replaced by any device, circuit or combination thereof capable of coupling signals to provide the equivalent electrical function, over a desired bandwidth, such as, but not limited to, baluns or 180 degree hybrid junctions with appropriate biasing circuits, to provide equivalent electrical function over a desired bandwidth.

In the highly linear mixer 20 of FIG. 2, each respective FET Q1, Q2, Q3, Q4 may have a symmetrical structure, but is not operated as a symmetrical device. Rather, a dc drain bias voltage, Vd, is applied to the drain terminal D of each respective FET Q1, Q2, Q3, Q4 through the IF transformer T3 so that each FET has a well defined source and drain. The dc biasing of drain terminal D ensures that source terminal S will be more negative than the drain terminal D. As a result, FET channel resistance in highly linear mixer 20 is controlled by gate-source voltage Keeping in mind the dc biasing of the drain terminals D of each respective FET Q1, Q2, Q3, Q4, an RF input signal received at the RF input terminal is applied to both the source terminal S and gate terminal G of each respective FET Q1, Q2, Q3, Q4 in a manner which cancels the RF input signal's contribution to the gate-source voltage. Accordingly, the RF input signal does not affect FET channel resistance in highly linear mixer 20, removing the source of modulation of FET channel resistance. FET channel resistance in highly linear mixer 20 is controlled almost exclusively by a LO input signal (LO drive signal) received at the LO input terminal and applied to the gate terminal G of each respective FET Q1, Q2, Q3, Q4.

The IF output signal of highly linear mixer 20 is generated at the drain terminal D of each respective FET Q1, Q2, Q3, Q4. IF transformer T3 couples each drain terminal D to the IF output terminal. As will be appreciated by one of ordinary skill in the art, because of the dc biasing of the drain terminals D higher than source terminals S, the IF output signal generated at the drain terminals D will not significantly affect FET channel resistance.

As shown in FIG. 2, LO transformer T1 couples the LO drive signal to both the first gate transformer T4 and the second gate transformer T5. RF transformer T2 couples the RF input signal to the source terminal S of each respective FET Q1, Q2, Q3, Q4. The RF input signal is also connected to both the first gate transformer T4 the and second gate transformer T5.

The first gate transformer T4 couples the LO drive to the gate terminal G of FET Q1, as well as to the gate terminal G of FET Q3. Concurrently, the first transformer T4 also couples at least a portion of the RF input signal to the gate terminal G of FET Q1, as well as to the gate terminal G of FET Q3. The second gate transformer T5, similarly, both the LO drive signal and at least a portion of the RF input signal to the gate terminal G of FET Q2, as well as to the gate terminal G of FET Q4.

The gate terminal G of FET Q1 and the gate terminal G of FET Q3 are each connected to first gate transformer T4 such that their respective gates G are at the same dc potential. Similarly, the gate terminal G of FET Q2 and the gate terminal G of FET Q4 are each connected to the second transformer T5 such that their respective gates G are at the same dc potential.

Cancellation of the contribution of the RF input signal, applied at the sources, to gate-source voltage is achieved by applying a modified RF voltage to the gate terminals G of each respective FET Q1, Q2, Q3, Q4 such that there is no net RF voltage between gate terminal G and source terminal S to affect FET channel resistance. This eliminates the largest distortion term in conventional resistive FET mixers.

More specifically regarding the modified voltage, the first gate transformer T4 superimposes the modified RF voltage to the LO drive signal at gate terminals G of FET pair Q1,Q3, and the second gate transformer T5 superimposes the modified RF voltage to the LO drive signals at gate terminals G of FET pair Q2, Q4. The value of the modified RF voltage needed at the gate to cancel the distortion is nominally equal to the RF voltage at the intrinsic source, which is at the edge of the gate, rather than the voltage at the external source terminal. Due to the resistance between the external source terminal and the intrinsic source, the value of the modified RF voltage applied at a gate is slightly less than the RF voltage applied at the external source terminal.

FIG. 2 also shows Vg applied at transformer T1. Vg sets the dc potential of the gate terminals G of each respective FET Q1, Q2, Q3, Q4. The dc gate-to-source voltage of the FETs Q1, Q2, Q3, Q4 is set by the voltage difference between Vg and the center tap of the secondary winding of transformer T2. With the center tap of transformer T2 at ground, as shown in FIG. 2, Vg would be typically set approximately at, or slightly negative of, the threshold voltage of the FETs Q1, Q2, Q3, Q4.

In simulation, the highly linear double balanced resistive FET mixer 20 described above provides a 60 dBm output IP3 with a LO drive level of 24 dBm. This performance is better than any known commercially available mixer. Highly linear mixer 20 has many practical applications, including, but not limited to, use in the front end of receivers for radar systems, communications systems, and signal intelligence systems (SIGNINT), as well as use in spectrum analysers and base stations for cellular telephone and other communication systems.

Figure 3:
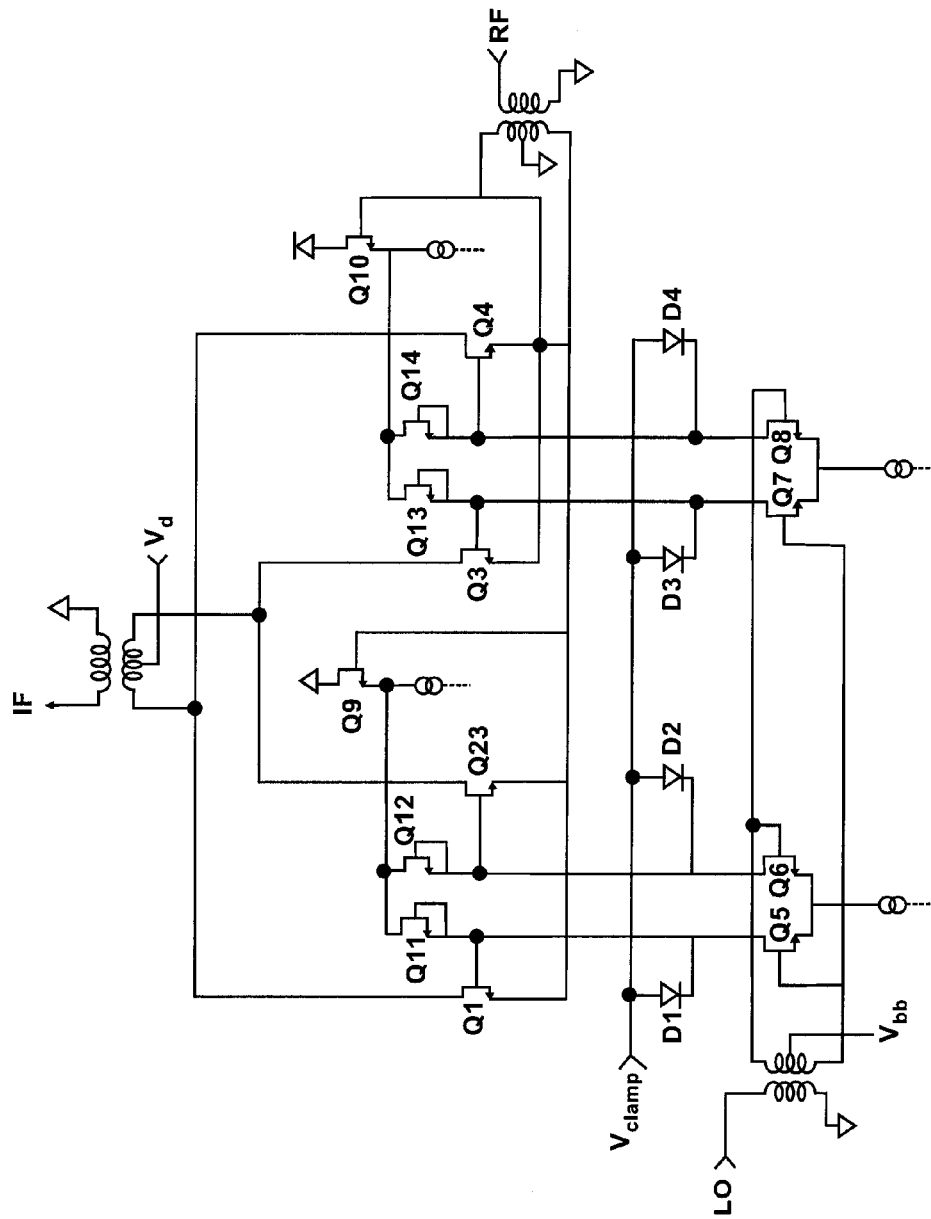
FIG. 3 is a schematic view of another preferred embodiment of a FET-based mixer circuit.

Referring to FIG. 3, a schematic view of another preferred embodiment of a highly linear FET mixer 30 is shown which also prevents RF voltage from modulating gate voltage in field effect transistors. Highly liner mixer 30 has similar performance characteristics as highly linear mixer 20 shown in FIG. 2 and described above, while being especially suited for implementation as a monolilthic integrated circuit. That is, the entire highly linear mixer 30 is easily built on a single semiconductor chip. Another benefit of mixer 30 arises because it does not include internal transformers or hybrid junctions. As such, mixer 30 is less susceptible to bandwidth limitations that are often associated with transformers or hybrid junctions.

As seen in FIG. 3, mixer 30 includes field effect transistors Q1, Q2, Q3, and Q4, which correspond to field effect transistors Q1, Q2, Q3, and Q4 of highly linear mixer 20. Also included are input terminal LO, for receiving a LO input signal, and associated LO transformer T1 for coupling the received LO input signal. Mixer 30 also includes input terminal RF, for receiving a RF input signal, and associated RF transformer T2 for coupling the received RF signal. IF transformer T3 couples IF output signals from the respective drains of the FETs Q1, Q2, Q3, Q4 to output terminal IF. Other components included in mixer 30, as shown in FIG. 3, include differential pair transistors Q5,Q6, differential pair transistors Q7,Q8, load transistors Q11, Q12, Q13, and Q14, transistors Q9, and Q10, and diodes D1, D2, D3, and D4.

RF transformer T2 couples the RF input signal to the respective sources of the FETs Q1, Q2, Q3, Q4, and to the respective gates of the transistors Q9, Q10. The LO transformer T1 couples the LO drive to the respective gates of differential transformers Q5, Q6, Q7, Q8. Differential transistor Q5 couples the LO drive from its drain to the gate of FET Q1, and differential transistor Q6 couples the LO drive from its drain to the gate of FET Q2. Likewise, for differential pair Q7,Q8, differential transistor Q7 couples the LO drive from its drain to the gate of FET Q3, and differential transistor Q8 couples the drive from its drain to the gate of FET Q4.

The transistors of differential pair Q5,Q6 are each associated with a different half-cycle of the LO input signal, as are the transistors of differential pair Q7,Q8. Further, differential transistors Q5 and Q7 are associated with one half-cycle, and differential transistors Q6 and Q8 are associated with the other half-cycle. FETs Q1 and Q3 are associated with the same half-cycle as differential transistors Q6 and Q8. Thus, each of these components conducts at the same time. Similarly, FETs Q2 and Q4 are associated with the same half-cycle and differential transistors Q5 and Q7.

Each of the load transistors Q11, Q12, Q13, Q14 presents a load impedance to one of the differential transistors Q5, Q6, Q7, Q8. Each load transistor Q11, Q12, Q13, Q14 has its source and gate tied together and connected to the drain of its associated differential transistor Q5, Q6, Q7, Q8 such that it presents low impedance at low current levels, and high impedance at higher current levels approaching saturation levels.

Cancellation of the RF input signal's contribution to the gate-source voltage of FET Q1 when conducting will now be described. When differential pair Q5,Q6 steers current through differential transistor Q6, based upon the LO drive cycle, load transistor Q11 presents a low impedance. This causes the gate voltage of FET Q1 to pull up to the source voltage of the transistor Q9. At the same time, load transistor Q12 presents a high impedance, causing the gate voltage of FET Q2 to pull down to a voltage controlled by diode D2 and Vclamp. The voltage Vclamp is applied to the input terminal that is connected to the anode of each of diodes D1, D2, D3, and D4. Because the source voltage of transistor Q9 follows RF voltage to the source of FET Q1, the gate-source voltage at FET Q1, when conducting, will always be independent of RF voltage. Accordingly, the source of FET channel modulation is cancelled. Similarly, the other FETs Q2, Q3, Q4, when conducting, are driven with a gate-source voltage that is independent of the RF voltage.

It will be recognized by those skilled in the art that, while the invention has been described above in terms of at least two preferred embodiments, it is not limited thereto. Various features and aspects of the above described invention may be used individually or jointly. Further, although the invention has been described in the context of its implementation in a particular environment and for particular purposes, those skilled in the art will recognize that its usefulness is not limited thereto and that the present invention can be beneficially utilized in any number of environments and implementations. Accordingly, the claims set forth below should be construed in view of the full breadth and spirit of the invention as disclosed herein.

What is claimed is:

1. A method for cancelling channel resistance modulation in a field effect transistor (FET) used in a frequency mixer, the mixer combining a received radio frequency (RF) input signal with a local oscillator (LO) signal to provide an intermediate frequency (IF) signal, wherein a FET has a gate, a source, and a drain, wherein a voltage appears at each of the gate, the source, and the drain when the FET is conducting, and wherein the modulation of the channel resistance is caused by modulation of the voltage of the RF input signal, comprising:
   applying a bias to the FET to distinguish the drain from the source such that channel resistance is associated with voltage between the gate and the source;
   superimposing at least a portion of the voltage of the RF input signal (RF voltage) on the LO signal to form a modified LO signal; and
   inputting the modified LO signal to the gate while inputting the RF input signal to the source.

2. The method of claim 1, wherein the bias is applied such that channel resistance is not associated with voltage between the drain and the gate.

3. The method of claim 1, wherein the bias causes voltage between the gate and the drain to be greater than voltage between the gate and the source.

4. The method of claim 1, wherein the applied bias is a voltage is applied to the drain.

5. The method of claim 1, wherein the RF voltage is superimposed such that channel resistance is associated with the LO signal and not the RF signal.

6. The method of claim 1, wherein:
the bias is applied such that an amount of channel resistance is dependent upon only voltage between the gate and the source;
the gate voltage is the same as the voltage of the modified LO signal;
the source voltage is the same as the RF voltage; and
the RF voltage is superimposed such that no net RF voltage appears between the gate and the source.

7. The method of claim 6, wherein the superimposed portion of the RF voltage is less than the entire RF voltage.

8. The method of claim 1, wherein the source and the drain are physically identical.

9. A FET mixer for mixing a radio frequency (RF) input signal, received at an RF terminal, with a local oscillator (LO) signal, received at an LO terminal, to provide, at an intermediate frequency (IF) terminal, an IF signal having low distortion, wherein a FET has a gate, a source, and a drain, comprising:
an RF signal coupler connected to the RF terminal and having a first RF port for outputting a first phase of the RF input signal and a second RF port for outputting the second phase of the RF input signal;
a LO signal coupler connected to the LO terminal and having a first LO port for outputting a first phase of the LO signal and a second LO port for outputting the second phase of the LO signal;
first and second transformers, each for superimposing at least a portion of the voltage of the RF input signal (RF voltage) to the LO signal to form a modified LO signal, the first transformer connected to the first LO port and to the RF terminal, the second transformer connected to the second RF port and to the RF terminal;
a first pair of FETs, the gate of each connected to the first transformer to receive the modified LO signal, the source of each connected to the RF coupler to receive the RF input signal, one source connected to the first RF port, and one source connected to the second RF port;
a second pair of FETs, the gate of each connected to the second transformer to receive the modified LO signal, the source of each connected to the RF coupler to receive the RF input signal, one source connected to the first RF port, and one source connected to the second RF port;
a drain bias circuit for biasing each FET to distinguish gate from source such that voltage between the gate and the drain is greater than voltage between gate and the source; and
an IF coupler, connected to the drain of each FET and to the IF terminal, to receive an output signal from each FET and to combine the received output signals into the IF output signal having low distortion.

10. The mixer of claim 9, wherein the IF output signal is not distorted by RF voltage modulation.

11. The mixer of claim 9, wherein the drain bias circuit biases each FET such that voltage at the drain does not contribute to channel resistance.

12. The mixer of claim 9, wherein the drain biasing circuit biases each FET such that an amount of channel resistance is dependent upon only voltage between the gate and the source.

13. The mixer of claim 9, wherein the drain biasing circuit applies a voltage to the drain of each FET.

14. The mixer of claim 9, wherein the first and second transformers superimpose the RF voltage such that the RF input signal does not contribute to channel resistance.

15. The mixer of claim 9, wherein:
the drain biasing circuit biases each FET such that an amount of channel resistance is dependent upon only voltage between the gate and the source;
the gate voltage of each FET is the same as the voltage of the modified LO signal applied to that gate;
the source voltage of each FET is the same as the voltage of the RF input signal applied to that source; and
each transformer superimposes the RF voltage such that for each FET, no net RF voltage appears between the gate and source.

16. The mixer of claim 15, wherein the superimposed portion of the RF voltage is less than the entire RF voltage.

17. The mixer of claim 9, wherein the source and the drain of each FET of the first pair and the second pairs of FETs are physically equivalent.

* * * * *